(12) United States Patent
Shibata et al.

(10) Patent No.: US 11,367,826 B2
(45) Date of Patent: Jun. 21, 2022

(54) PIEZOELECTRIC LAMINATE, METHOD OF MANUFACTURING THE PIEZOELECTRIC LAMINATE AND PIEZOELECTRIC DEVICE

(71) Applicant: SUMITOMO CHEMICAL COMPANY, LIMITED, Tokyo (JP)

(72) Inventors: Kenji Shibata, Ibaraki (JP); Kazutoshi Watanabe, Ibaraki (JP); Fumimasa Horikiri, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 573 days.

(21) Appl. No.: 16/296,291

(22) Filed: Mar. 8, 2019

(65) Prior Publication Data

US 2020/0028066 A1 Jan. 23, 2020

(30) Foreign Application Priority Data

Mar. 14, 2018 (JP) .............................. JP2018-47249

(51) Int. Cl.
*H01L 41/187* (2006.01)
*H01L 41/08* (2006.01)
*H01L 41/314* (2013.01)

(52) U.S. Cl.
CPC ........ *H01L 41/081* (2013.01); *H01L 41/1873* (2013.01); *H01L 41/314* (2013.01)

(58) Field of Classification Search
CPC .. H01L 41/081; H01L 41/1873; H01L 41/314
See application file for complete search history.

(56) References Cited

U.S. PATENT DOCUMENTS

| 2007/0126313 | A1 | 6/2007 | Ueno et al. |
| 2007/0159028 | A1 | 7/2007 | Nagaya et al. |
| 2009/0189490 | A1* | 7/2009 | Shibata ............... H01L 41/1873 310/360 |
| 2009/0236944 | A1 | 9/2009 | Shibata et al. |
| 2011/0121690 | A1* | 5/2011 | Shibata ................. C04B 35/495 310/363 |
| 2013/0234564 | A1* | 9/2013 | Sakashita ............ H01L 41/1873 310/365 |
| 2014/0145365 | A1* | 5/2014 | Omenetto ............... H01L 21/02 264/104 |

(Continued)

FOREIGN PATENT DOCUMENTS

| JP | 2007-184513 A | 7/2007 |
| JP | 2008-159807 A | 7/2008 |

(Continued)

OTHER PUBLICATIONS

Search Report issued in European Patent Application No. 19/162,370 dated Jul. 30, 2019.

(Continued)

*Primary Examiner* — J. San Martin
(74) *Attorney, Agent, or Firm* — Pearne & Gordon LLP (57) ABSTRACT

There is provided a piezoelectric laminate, including: a substrate; and a piezoelectric film formed on the substrate, wherein the piezoelectric film is a film containing an alkali niobium oxide of a perovskite structure represented by a composition formula of $(K_{1-x}Na_x)NbO_3$ ($0<x<1$), and having Young's modulus of less than 100 GPa.

10 Claims, 4 Drawing Sheets

(56) References Cited

U.S. PATENT DOCUMENTS

| | | | |
|---|---|---|---|
| 2016/0294306 A1 | 10/2016 | Kobayashi | |
| 2016/0365503 A1* | 12/2016 | Ikeuchi | C04B 35/465 |
| 2018/0301618 A1 | 10/2018 | Shibata | |
| 2018/0326727 A1 | 11/2018 | Mawatari | |

FOREIGN PATENT DOCUMENTS

| | | |
|---|---|---|
| JP | 2010-016018 A | 1/2010 |
| JP | 2017-076730 A | 4/2017 |
| WO | 2011/099231 A1 | 8/2011 |
| WO | 2017-082049 A1 | 5/2017 |

OTHER PUBLICATIONS

Office Action issued for corresponding European application No. 19162370.1 dated Mar. 11, 2020.
Dittmer, Robert, et al.: "Large block force in BiNaTiO-based lead-free piezoceramics", Scripta Materialia, Mar. 25, 2012, pp. 100-103, vol. 67, No. 1, Elsevier, Amsterdam, NL, XP028489092.

* cited by examiner

PIEZOELECTRIC LAMINATE, METHOD OF MANUFACTURING THE PIEZOELECTRIC LAMINATE AND PIEZOELECTRIC DEVICE

BACKGROUND

Technical Field

The present disclosure relates to a piezoelectric laminate, a method of manufacturing a piezoelectric laminate, and a piezoelectric device.

Description of Related Art

A piezoelectric material is utilized widely for a functional electronic component such as a sensor and an actuator. Lead-based materials, in particular, PZT-based ferroelectrics represented by a composition formula of $Pb(Zr_{1-x}Ti_x)O_3$ are used widely for a material of the piezoelectric material. Since PZT-based piezoelectric material contains lead, it is not preferable from a viewpoint of a pollution prevention, and the like. Therefore, potassium sodium niobate (KNN) is suggested as a material of the piezoelectric material not containing lead (see patent documents 1 and 2, for example). Recently, it is strongly required to improve a performance of the piezoelectric material configured by the material not containing lead such as KNN.

PRIOR ART DOCUMENT

Patent document 1: Japanese Patent Laid Open Publication No. 2007-184513
Patent document 2: Japanese Patent Laid Open Publication No. 2008-159807

SUMMARY

The present disclosure discloses that a durability of the piezoelectric film can be improved, the piezoelectric film being formed using alkali niobium oxide.

According to an aspect of the present disclosure, there is provided a piezoelectric laminate and a related technique thereof, including:
a substrate; and
a piezoelectric film formed on the substrate,
wherein the piezoelectric film is a film containing an alkali niobium oxide of a perovskite structure represented by a composition formula of $(K_{1-x}Na_x)NbO_3$ ($0<x<1$), and having Young's modulus of less than 100 GPa.

According to the present disclosure, the durability of the piezoelectric film can be improved, the piezoelectric film being formed using alkali niobium oxide.

DETAILED DESCRIPTION

An Embodiment of the Present Disclosure

Figure 1:
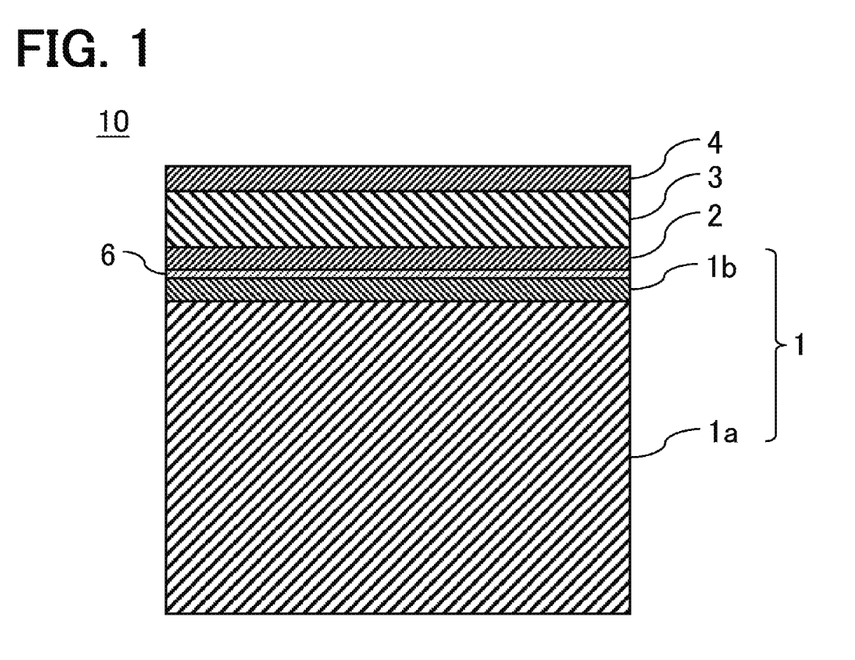
FIG. 1 is a view showing an example of a cross-sectional structure of a piezoelectric laminate according to an embodiment of the present disclosure.
Figure 2:
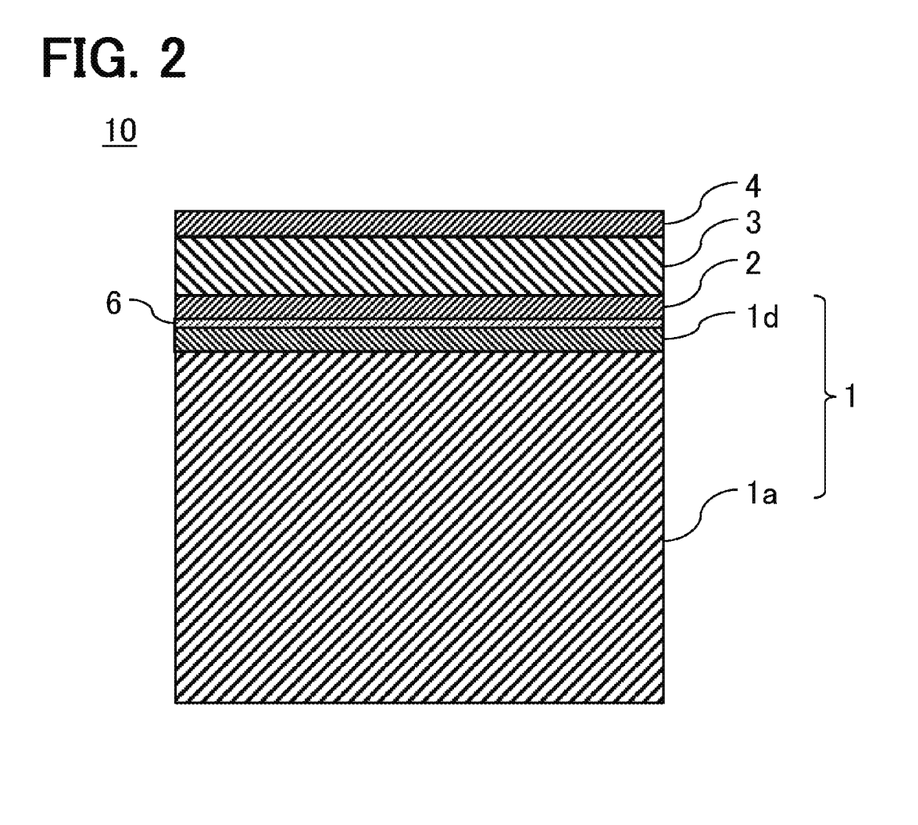
FIG. 2 is a view showing a modified example of the cross-sectional structure of the piezoelectric laminate according to an embodiment of the present disclosure.

An embodiment of the present disclosure will be described hereafter, with reference to drawings.
(1) Method of manufacturing a piezoelectric laminate
In the present embodiment, as an example, explanation will be given for a case of forming a laminate (laminated substrate) 10 having a piezoelectric film 3 (also referred to as "piezoelectric laminate 10" hereafter) as shown in FIG. 1, by performing:
preparing a substrate 1 (step 1);
forming a bottom electrode film (first electrode film) 2 on the substrate 1 (step 2);
forming the piezoelectric film (piezoelectric thin film) 3 on the bottom electrode film 2 (step 3); and
forming a top electrode film (second electrode film) 4 on the piezoelectric film 3 (step 4). As shown in FIG. 1, the piezoelectric laminate 10 according to the present embodiment includes the substrate 1, the bottom electrode film 2 formed on the substrate 1, the piezoelectric film 3 formed on the bottom electrode film 2, and the top electrode film 4 formed on the piezoelectric film 3. Each step will be described in detail.
(Step 1: Preparing a Substrate)
In this step, first, the substrate 1 is prepared. As the substrate 1, a single-crystal silicon (Si) substrate 1a on which a surface oxide film ($SiO_2$-film) 1b such as a thermal oxide film or a CVD (Chemical Vapor Deposition) oxide film is formed, namely, a Si-substrate having the surface oxide film, can be used preferably. Further, as shown in FIG. 2, a Si-substrate 1a having an insulating film 1d formed on its surface may also be used as the substrate 1, the insulating film id containing an insulating material other than $SiO_2$. Further, a Si-substrate 1a in which Si-(100) plane or Si-(111) plane, etc., is exposed on a surface thereof, namely, a Si-substrate not having the surface oxide film 1b or the insulating film 1d may also be used as the substrate 1. Further, an SOI (Silicon On Insulator) substrate, a quartz glass ($SiO_2$) substrate, a gallium arsenide (GaAs) substrate, a sapphire ($Al_2O_3$) substrate, a metal substrate containing a metal material such as stainless steel (SUS) may also be used as the substrate 1. The single-crystal Si-substrate 1a has a thickness of 300 to 1000 μm for example, and the surface oxide film 1b has a thickness of 5 to 3000 nm for example.
(Step 2: Forming a Bottom Electrode Film)
After step 1 is ended, the bottom electrode film 2 is formed on the substrate 1. The bottom electrode film 2 can be formed using platinum (Pt) for example. The bottom electrode film 2 is a single-crystal film or a poly-crystal film (they are also referred to as a Pt-film hereafter). Preferably, crystals constituting the Pt-film are oriented preferentially in (111) plane direction with respect to a surface of the substrate 1. Namely, it is preferable that a surface of the Pt-film (a surface which is a base of the piezoelectric film 3) is mainly constituted of Pt-(111) plane. The Pt-film can be formed by a method such as a sputtering method, or an evaporation method. In addition to Pt, the bottom electrode film 2 may also be formed using various metals such as gold (Au), ruthenium (Ru), or iridium (Ir), an alloy mainly composed of the above various metals, or a metallic oxide such as strontium ruthenate ($SrRuO_3$) or lanthanum nickel oxide ($LaNiO_3$), etc. An adhesion layer 6 mainly composed of titanium (Ti), tantalum (Ta), titanium oxide (TiO$_2$), or nickel (Ni), etc., for example may also be provided between the substrate 1 and the bottom electrode film 2 in order to enhance an adhesion between them. The adhesion layer 6 can be formed by a method such as a sputtering method, or an evaporation method. The bottom electrode film 2 has a thickness of 100 to 400 nm for example, and the adhesion layer 6 has a thickness of 1 to 200 nm for example.

(Step 3: Forming a Piezoelectric Film)

After step 2 is ended, the piezoelectric film 3 is formed on the bottom electrode film 2.

The piezoelectric film 3 can be formed using alkali niobium oxide which contains potassium (K), sodium (Na), and niobium (Nb), and which is represented by a composition formula of $(K_{1-x}Na_x)NbO_3$. Namely, the piezoelectric film 3 can be formed using potassium sodium niobate (KNN). A coefficient x [=Na/(K+Na)] in the above composition formula is a value in a range of 0<x<1, preferably 0.4≤x≤0.7. The piezoelectric film 3 is a KNN polycrystalline film (also referred to as a KNN-film 3 hereafter). A crystal structure of KNN is a perovskite structure.

Preferably, crystals constituting the KNN-film 3 are oriented preferentially in (001) plane direction with respect to the surface of the substrate 1 (the Si-substrate 1a when that the substrate 1 is for example the Si-substrate 1a including the surface oxide film 1b or the insulating film 1d, etc.). Namely, it is preferable that a surface of the KNN-film 3 (a surface which is a base of the top electrode film 4) is mainly constituted of KNN-(001) plane. By forming the KNN-film 3 directly on the Pt-film oriented preferentially in (111) plane direction with respect to the surface of the substrate 1, crystals constituting the KNN-film 3 can be easily oriented preferentially in (001) plane direction with respect to the surface of the substrate 1. For example, 80% or more crystals of a crystal group constituting the KNN-film 3 can be easily oriented in (001) plane direction with respect to the surface of the substrate 1, and therefore 80% or more region of the surface of the KNN-film 3 can be easily KNN-(001) plane.

The KNN-film 3 contains a metallic element selected from a group consisting of copper (Cu) and manganese (Mn) in a concentration range of for example 0.2 at % or more and 2.0 at % or less, preferably more than 0.6 at % and 2.0 at %° or less. The KNN-film 3 may contain an element such as lithium (Li), Ta, or antimony (Sb) other than K, Na, Nb, Cu, and Mn at a concentration where Young's modulus of the KNN-film 3 can be maintained in a range described later.

The KNN-film 3 can be formed by a method such as a sputtering method, a PLD (Pulsed Laser Deposition) method, or a sol-gel method. When the KNN-film 3 is formed for example by a sputtering method, a composition ratio of the KNN-film 3 can be adjusted by controlling a composition of a target material used during sputtering deposition for example. The target material can be manufactured by mixing and burning $K_2CO_3$-powder, $Na_2CO_3$-powder, $Nb_2O_5$-powder, CuO-powder, and MnO-powder, etc., for example. The composition of the target material can be controlled by adjusting a mixed ratio of $K_2CO_3$-powder, $Na_2CO_3$-powder, $Nb_2O_5$-powder, CuO-powder, and MnO-powder, etc. The KNN-film 3 containing Cu or Mn in the above concentration range, can be formed by using $(K_{1-x}Na_x)NbO_3$ sintered ceramics containing Cu or Mn in a concentration range of for example 0.2 at %° or more and 2.0 at % or less. The KNN-film 3 has a thickness of 0.5 to 5 μm for example.

A deposition temperature at which the KNN-film 3 containing Cu or Mn in a concentration range of for example 0.2 at % or more and 0.6 at % or less is formed (a temperature shown by a heater of a film-forming apparatus such as a sputtering apparatus), can be for example more than 600° C. and 700° C. or less, preferably 650° C. or more and 680° C. or less.

The deposition temperature at which the KNN-film 3 containing Cu or Mn in the concentration range of for example more than 0.6 at % and 2.0 at % or less is formed, can be for example 500° C. or more and 700° C. or less, preferably 600° C. or more and 680° C. or less, and more preferably 650° C. or more and 680° C. or less.

The KNN-film 3 formed as described above has Young's modulus of less than 100 GPa for example, preferably 53 GPa or more and 73 GPa or less, more preferably 53 GPa or more and 68 GPa or less. Young's modulus used here is a value measured by a pump/probe method described in Ultrasonics 56 (2015), FIG. 1 of p. 91, IEEE Ultrasonics Symposium, FIG. 1 of p. 1434, and the like, for example.

In conventional techniques, the KNN-film having Young's modulus of less than 100 GPa cannot be achieved. After intensive studies by the present inventors, it is found for the first time that the KNN-film 3 having Young's modulus of less than 100 GPa can be achieved by adding Cu or Mn into the KNN-film 3 in the above concentration range, and setting the deposition temperature in the above range.

For example, by adding Cu or Mn into the KNN-film 3 in a concentration range of 0.2 at % or more and 0.6 at % or less, and setting the deposition temperature in a range of more than 600° C. and 700° C. or less, Young's modulus of the KNN-film 3 can be less than 100 GPa. In this case, by setting the deposition temperature, for example, in a range of 650° C. or more and 680° C. or less, Young's modulus of the KNN-film 3 can be further lowered, for example, can be 73 GPa or less.

Further, for example, by adding Cu or Mn into the KNN-film 3 in a concentration range of more than 0.6 at % and 2.0 at % or less, and setting the deposition temperature in a range of 500° C. or more and 700° C. or less, Young's modulus of the KNN-film 3 can be less than 100 GPa. In this case, by setting the deposition temperature in a range of 600° C. or more and 680° C. or less for example, Young's modulus of the KNN-film 3 can be further lowered, for example, can be 73 GPa or less. Further, in this case, by setting the deposition temperature in a range of 650° C. or more and 680° C. or less for example, Young's modulus of the KNN-film 3 can be further lowered, for example, can be 68 GPa or less. It is already found by the present inventors that Young's modulus of the KNN-film 3 is 63 GPa when Cu or Mn is added into the KNN-film 3 in the concentration range of more than 0.6 at/o and 2.0 at % or less, and when the deposition temperature is set to 650° C.

The KNN-film 3 has preferably low Young's modulus. However, according to a current technique, it is difficult to achieve the KNN-film 3 having Young's modulus of less than 53 GPa, even in a case of adding Cu or Mn into the KNN-film 3 in the above concentration range, and setting the deposition temperature in the above range. Further, even when the deposition temperature is set to more than 700° C., an effect of lowering Young's modulus of the KNN-film 3 cannot be obtained, and in addition, a thermal history of the KNN-film 3 increases. Therefore, the deposition temperature is set to preferably 700° C. or less.

A Raman spectrum has an $NbO_6$-peak in a range of 617.5 to 622.5 cm$^{-1}$, preferably in a range of 619.5 to 622.5 cm$^{-1}$, the Raman spectrum being obtained by performing Raman spectroscopy analysis to the KNN-film 3 formed as described above. This peak is information regarding a symmetric stretch vibration of $NbO_6$. The higher deposition temperature at which the KNN-film 3 is formed, the closer to 622 $cm^{-1}$ the $NbO_6$-peak is. The closer to 622 $cm^{-1}$ the $NbO_6$-peak is, the lower defection is, the defection being oxygen vacancy, etc., due to $NbO_6$ in the KNN-film 3. It is unknown why the higher deposition temperature of the KNN-film 3, the closer to 622 $cm^{-1}$ the $NbO_6$-peak is. At a current stage, conceivably this is because the defection such as oxygen vacancy in the KNN-film 3 is reduced by increasing the deposition temperature at which the KNN-film 3 is formed. From a viewpoint that the $NbO_6$-peak is closed to 622 $cm^{-1}$, the deposition temperature at which the KNN-film 3 is formed, is preferably more than 500° C. and 700° C. or less, more preferably 600° C. or more and 700° C. or less, and furthermore preferably 650° C. or more and 700° C. or less. When the deposition temperature is 500° C., the above $NbO_6$-peak varies in some cases. When the deposition temperature is more than 700° C., as described above, the effect of lowering Young's modulus of the KNN-film 3 cannot be obtained, and in addition, the thermal history of the KNN-film 3 increases.

(Step 4: Forming a Top Electrode Film)

After step 3 is ended, the top electrode film 4 can be formed on the KNN-film 3. The top electrode film 4 can be formed using various metals such as Pt, Au, aluminum (Al), or Cu, or an alloy of these various metals, for example. The top electrode film 4 can be formed by a method such as a sputtering method, an evaporation method, a plating method, or a metal paste method. The top electrode film 4 does not greatly affect the crystal structure of the KNN-film 3 unlike the bottom electrode film 2. Therefore, a material and a crystal structure of the top electrode film 4, and a method of forming the top electrode film 4 are not particularly limited. An adhesion layer mainly composed of Ti, Ta, $TiO_2$, Ni, etc., for example may be provided between the KNN-film 3 and the top electrode film 4 in order to enhance an adhesion between them. The top electrode film 4 has a thickness of for example 100 to 5000 nm, and the adhesion layer has a thickness of for example 1 to 200 nm in a case of providing the adhesion layer.

(2) Constitution of Piezoelectric Device

Figure 3:
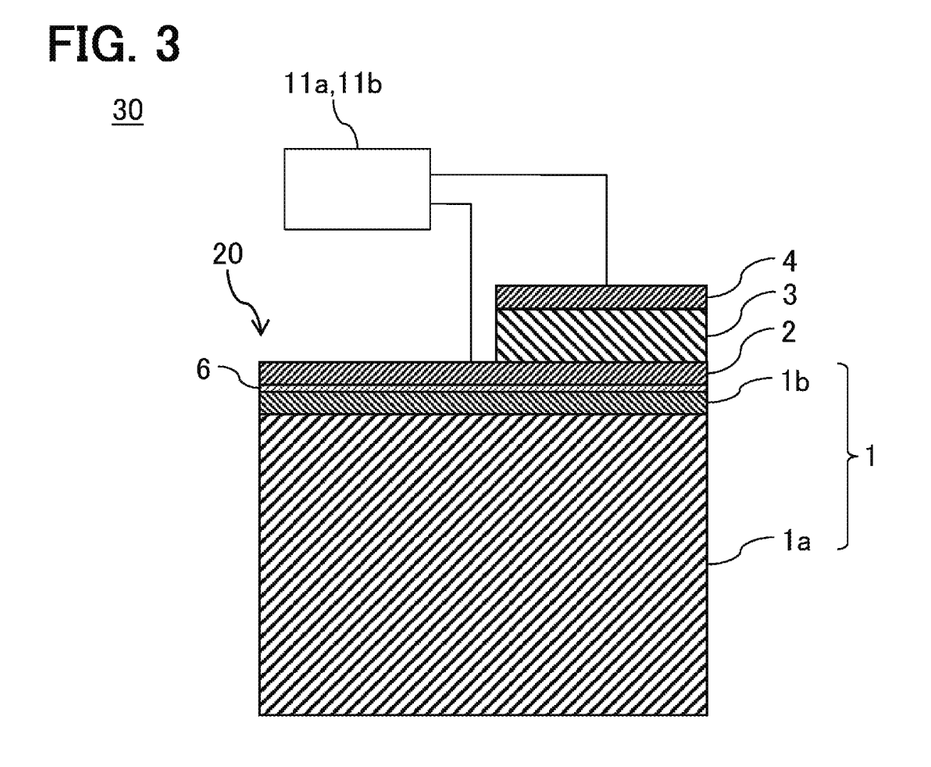
FIG. 3 is a view showing an example of a schematic structure of a piezoelectric device according to an embodiment of the present disclosure.

FIG. 3 shows a schematic constitution view of a device 30 having the KNN-film 3 of the present embodiment (also referred to as "piezoelectric device 30" hereafter). The piezoelectric device 30 is constituted including at least an element 20 having the KNN-film 3 (also referred to as "piezoelectric element 20" hereafter), and a voltage application unit 11a or a voltage detection unit 11b connected to the piezoelectric element 20. The piezoelectric element 20 can be obtained by forming the above piezoelectric laminate 10 into a prescribed shape by etching, etc., and the piezoelectric device 30 can be obtained by connecting the voltage application unit 11a or the voltage detection unit 11b to the piezoelectric element 20. The voltage application unit 11a is a means for applying a voltage between the bottom electrode film 2 and the top electrode film 4, and the voltage detection unit 11b is a means for detecting a voltage generated between the bottom electrode film 2 and the top electrode film 4. Publicly-known various means can be used as the voltage application unit 11a and the voltage detection unit 11b.

By connecting the voltage application unit 11a between the bottom electrode film 2 and the top electrode film 4 of the piezoelectric element 20, the piezoelectric device 30 can function as an actuator. By applying a voltage between the bottom electrode film 2 and the top electrode film 4 using the voltage application unit 11a, the KNN-film 3 can be deformed. Various members connected to the piezoelectric device 30 can be actuated due to the above deformation motion. In this case, the piezoelectric device 30 can be applied to a head for an inkjet printer, a MEMS mirror for a scanner, and a vibrator for an ultrasonic generator, etc., for example.

By connecting the voltage detection unit 11b between the bottom electrode film 2 and the top electrode film 4 of the piezoelectric element 20, the piezoelectric device 30 can function as a sensor. When the KNN-film 3 is deformed according to a variation of some physical quantity, a voltage is generated between the bottom electrode film 2 and the top electrode film 4 due to the deformation. By detecting this voltage using the voltage detection unit 11b, the physical quantity applied to the KNN-film 3 can be measured. In this case, the piezoelectric device 30 can be applied to an angular velocity sensor, an ultrasonic sensor, a pressure sensor, and an acceleration sensor, etc., for example.

(3) Effect Obtained by the Present Embodiment

According to the present embodiment, one or more of the following effects can be obtained.

(a) Since the KNN-film 3 has Young's modulus of less than 100 GPa, a durability of the KNN-film 3 can be improved. For example, a deterioration rate of a piezoelectric constant $d_{31}$ calculated from the following (formula 1) can be 10% or less. Since the durability of the KNN-film 3 is improved, a reliability (enhance a degree of reliability) of the piezoelectric device 30 such as the sensor or the actuator can be improved, the sensor or the actuator being manufactured by processing the piezoelectric laminate 10 having the KNN-film 3.

Deterioration rate of piezoelectric constant $d_{31}$(%)={(initial piezoelectric constant $d_{31}$)−(piezoelectric constant $d_{31}$ after driven billion times)/(initial piezoelectric constant $d_{31}$)}×100     (Formula 1)

In the above (formula 1), "initial piezoelectric constant $d_{31}$" is a piezoelectric constant $d_{31}$ measured by applying an electric field of 100 kV/cm in a thickness direction, to the KNN-film 3 driven 0 (zero) numbers of times, namely not driven even once. Further, "piezoelectric constant $d_{31}$ after driven billion times" is a piezoelectric constant $d_{31}$ measured by applying the electric field of 100 kV/cm in the thickness direction, to the KNN-film 3 after driven billion times by applying an electric field of sin-wave of 0 to 300 kV/cm.

(b) Since Young's modulus of the KNN-film 3 is lowered, crack (breakage) of the KNN-film 3 hardly occurs when the KNN-film 3 is driven. Therefore, the KNN-film 3 has a longer life than a conventional KNN-film.

(c) Since Cu or Mn is added into the KNN-film 3 in the concentration range of more than 0.6 at % and 2.0 at % or less, Young's modulus of the KNN-film 3 can be less than 100 GPa, even when lowering the deposition temperature at which the KNN-film 3 is formed (for example, even when setting the deposition temperature in a range of 500° C. or more and 600° C. or less). Since the deposition temperature at which the KNN-film 3 is formed, is set to low, the thermal history of the KNN-film 3 can be reduced. On the one hand, when Cu or Mn is added into the KNN-film 3 in the concentration range of 0.2 at % or more and 0.6 at % or less, Young's modulus of the KNN-film 3 cannot be less than 100 GPa in some cases, unless the deposition temperature is more than 600° C.

(d) Since Cu or Mn is added into the KNN-film 3 in the concentration range of 0.2 at % or more and 2.0 at % or less, an effect of improving a dielectric voltage (dielectric strength) can be obtained in addition to the effect of lowering Young's modulus.

In order to simultaneously obtain the effect of lowering Young's modulus and the effect of improving the dielectric voltage in a good balance, it is necessary to set the concentration of Cu or Mn in the KNN-film 3 to 0.2 at % or more and 2.0 at % or less.

When a total concentration of Cu and Mn in the KNN-film 3 is less than 0.2 at %, the effect of lowering Young's modulus of the KNN-film 3 cannot be obtained in some cases. Further, when the total concentration of Cu and Mn in the KNN-film 3 is less than 0.2 at %, the above effect of improving the dielectric voltage of the KNN-film 3 cannot be obtained in some cases. Further, when the total concentration of Cu and Mn in the KNN-film 3 is more than 2.0 at %, Cu or Mn is dispersed and deposited in the KNN-film 3 in some cases. As a result, the KNN-film 3 becomes hard, namely, Young's modulus of the KNN-film 3 becomes 100 GPa or more, in some cases.

(e) Since the dielectric voltage of the KNN-film 3 is improved, a higher electric field than before can be applied to the KNN-film 3. As a result, for example, it is possible to measure the piezoelectric constant $d_{31}$ by applying the electric field of 100 kV/cm, or drive the KNN-film 3 billion times by applying the electric field of sin-wave of 0 to 300 kV/cm, to calculate the above deterioration rate. On the other hand, in a conventional KNN-film not containing Cu or Mn, or a conventional KNN-film containing Cu or Mn at a concentration of less than 0.2 at %, an dielectric breakdown sometimes occurs when applying the above high electric filed, because the dielectric voltage is insufficient. Therefore, in the conventional KNN-film, only the electric field of 30 kV/cm can be applied to measure the piezoelectric constant $d_{31}$, and only the electric field of sin-wave of 0 to 100 kV/cm can be applied to drive the KNN-film billion times. In the KNN-film 3 according to the present embodiment, the piezoelectric constant $d_{31}$ can be measured by applying the electric field of equal to or more than three times higher than before, or the KNN-film 3 can be driven by applying the above high electric field. Thereby, the deterioration rate can be measured under stricter conditions than before. Therefore, higher reliability of the piezoelectric device 30 can be obtained.

(f) The Raman spectrum has the $NbO_6$-peak in a range of 617.5 to 622.5 $cm^{-1}$, the Raman spectrum being obtained by performing Raman spectroscopy analysis to the KNN-film 3. Therefore, higher reliability of the piezoelectric device 30 can be obtained. This is because the KNN-film 3 having the above Raman spectrum has low oxygen vacancy. Therefore, the following situation can be suppressed: the oxygen vacancy reacts with a metal constituting the electric film, resulting in causing the dielectric breakdown of the KNN-film 3.

Other Embodiment

As described above, explanation has been given specifically for the embodiments of the present disclosure. However, the present disclosure is not limited thereto, and can be variously modified in a range not departing from the gist of the disclosure.

For example, in addition to the metallic element selected from the group consisting of Cu and Mn, or instead of these metallic elements, the KNN-film 3 may contain other metallic element obtained an effect equivalent to Cu or Mn at a concentration where Young's modulus of the KNN-film 3 can be maintained to less than 100 GPa. In this case as well, similar effect as the above embodiment can be obtained.

Further, for example, the above piezoelectric device 30 may function as a filter device such as Surface Acoustic Wave (SAW) filter. In this case, the piezoelectric laminate 10 may not include the bottom electrode film 2. Further, in this case, the piezoelectric device 30 (piezoelectric element 20) includes a plurality of pattern electrodes obtained by forming the electrode film (top electrode film 4) into a prescribed pattern. Further, in this case, the voltage application unit 11a and the voltage detection unit 11b are respectively connected between the pattern electrodes.

Further, for example, the substrate 1 may be removed from the piezoelectric laminate 10 when forming the above piezoelectric laminate 10 into the piezoelectric element 20, as long as the piezoelectric device 30 manufactured using the piezoelectric laminate 10 (piezoelectric element 20) is applied to desired applications such as a sensor or an actuator.

EXAMPLES

Explanation will be given for an experimental result supporting an effect of the above embodiment hereafter.

A Si-substrate with a surface of (100) plane direction, a thickness of 610 μm, a diameter of 6 inches, and having a thermal oxide film (a thickness of 200 nm) formed on its surface, was prepared as a substrate. Then, a piezoelectric laminate was manufactured by forming a Ti-layer (thickness of 2 nm) as an adhesion layer, a Pt-film (oriented preferentially in (111) plane direction with respect to a surface of the substrate and having a thickness of 200 nm) as a bottom electrode film, and a KNN-film (oriented preferentially in (001) plane direction with respect to the surface of the substrate and having a thickness of 2 μm) as a piezoelectric film in this order on the thermal oxide film of the substrate. A Cu-concentration (CuO-concentration) in the KNN-film was 2.0 at %.

The Ti-layer is formed by an RF magnetron sputtering method. Conditions for forming the Ti-layer are as follows.
Deposition temperature: 300° C.
RF power: 1200 W
Gas: Ar-gas
Pressure in Ar-gas atmosphere: 0.3 Pa
Deposition time: 1 minute The Pt-film is formed by the RF magnetron sputtering method. Conditions for forming the Pt-film are as follows.
Deposition temperature: 300° C.
RF power: 1200 W
Gas: Ar-gas
Pressure in Ar-gas atmosphere: 0.3 Pa
Deposition time: 5 minutes The KNN-film is formed by the RF magnetron sputtering method. Conditions for forming the KNN-film are as follows.
Deposition temperature: 500° C., 600° C., 700° C.
RF power: 2200 W
Gas: Ar+$O_2$ mixed gas
Pressure in Ar+$O_2$ mixed gas atmosphere: 0.3 Pa
Partial pressure of Ar-gas to $O_2$-gas (Ar-partial pressure/$O_2$-partial pressure (ratio of partial pressure)): 25/1
Deposition rate: 1 μm/hr $(K_{1-x}Na)NbO_3$ sintered ceramics having a composition of (K+Na)/Nb=0.8 to 1.2 and Na/(K+Na)=0.4 to 0.7, and containing Cu at a concentration of 2.0 at %, was used as a sputtering target material for forming the KNN-film into which Cu was added. The target material was formed as follows: $K_2CO_3$-powder, $Na_2CO_3$-powder, $Nb_2O_5$-powder, and CuO-powder were mixed for 24 hours using a ball mill, the mixture was provisionally burned at 850° C. for 10 hours, then pulverized using again the ball mill, and molded under a pressure of 200 MPa, and thereafter burned at 1080° C. The composition of the target material was controlled by adjusting a mixed ratio of $K_2CO_3$-powder, $Na_2CO_3$-powder, $Nb_2O_5$-powder, and CuO-powder, and measured by EDX (energy dispersive X-ray spectrometry) before performing deposition.

(Evaluation of $NbO_6$-Peak of Raman Spectrum)

An evaluation of the $NbO_6$-peak of the Raman spectrum is performed using the Raman spectrum obtained using Raman spectroscopy method (Raman spectroscopy apparatus). Conditions when obtaining the Raman spectrum are as follows.

Wavelength: 532 nm
Power: 8 mW
Objective lens: 20× (spot size: about 5 μm)
Temperature: room temperature (~23° C.)

Figure 4A:
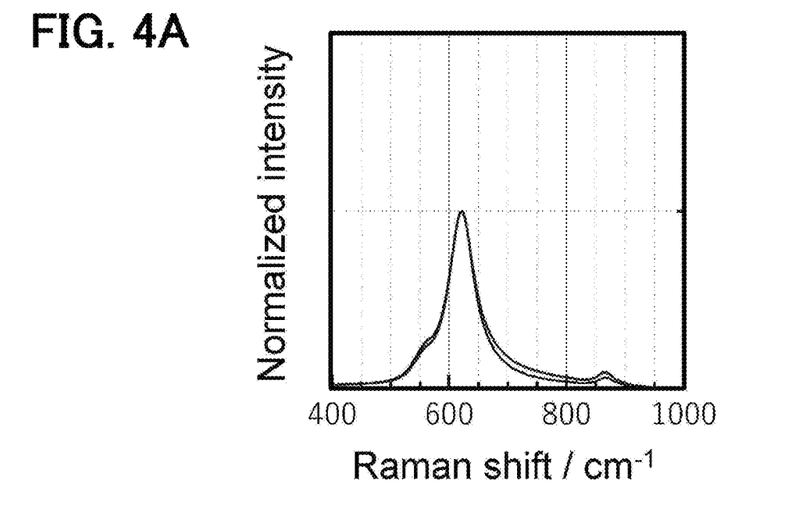
FIG. 4A is a graph of a part of a Raman spectrum obtained by performing Raman spectroscopy analysis to a piezoelectric film.

FIG. 4A shows a part of the Raman spectrum of sample whose deposition temperature is 700° C. From FIG. 4A, it is found that the Raman spectrum of a KNN-film has a peak in the vicinity of 620 $cm^{-1}$. It is also found by the present inventors that in each of samples whose deposition temperature is 500° C. or 600° C., the KNN-film has the peak in the vicinity of 620 $cm^{-1}$, as shown in FIG. 4A.

Figure 4B:
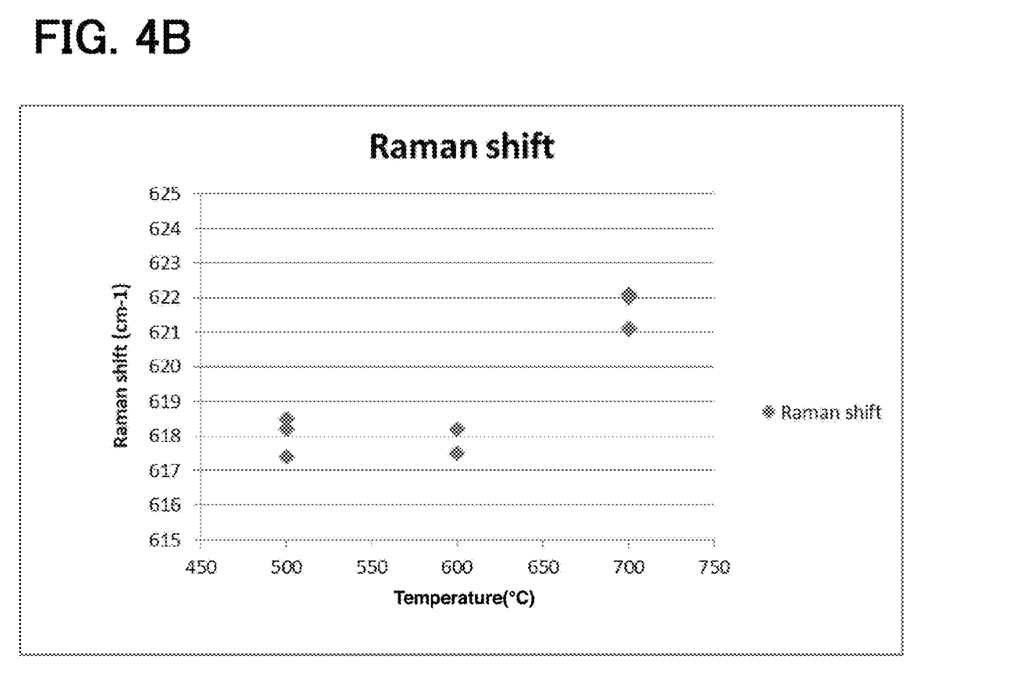
FIG. 4B is a view showing an evaluation result of a peak of a symmetric stretch vibration of $NbO_6$ in the Raman spectrum of the piezoelectric film.

From FIG. 4B, it is found that the higher deposition temperature, the higher $NbO_6$-peak in the Raman spectrum becomes, for example, it becomes closer to 622 $cm^{-1}$. Further, from FIG. 4B, it is found by the present inventors that the $NbO_6$-peak in the Raman spectrum varies depending on the sample, when the deposition temperature is 500° C.

Preferable Aspects of the Present Disclosure

Preferable aspects of the present disclosure will be supplementarily described hereafter.

(Supplementary Description 1)

According to an aspect of the present disclosure, there is provided a piezoelectric laminate, including:

a substrate; and
a piezoelectric film formed on the substrate, wherein the piezoelectric film is a film containing an alkali niobium oxide of a perovskite structure represented by a composition formula of $(K_{1-x}Na_x)NbO_3$ (0<x<1), and having Young's modulus of less than 100 GPa, preferably 53 GPa or more and 73 GPa or less, and more preferably 53 GPa or more and 68 GPa or less.

(Supplementary Description 2)

Preferably, there is provided the laminate of the supplementary description 1, wherein a Raman spectrum has an $NbO_6$-peak in a range of 617.5 $cm^{-1}$ to 622.5 $cm^{-1}$, preferably in a range of 619.5 $cm^{-1}$ to 622.1 $cm^{-1}$, the Raman spectrum being obtained by performing Raman spectroscopy analysis to the piezoelectric film.

(Supplementary Description 3)

Preferably, there is provided the laminate of the supplementary description 1 or 2, wherein the piezoelectric film contains a metallic element selected from a group consisting of Cu and Mn at a concentration of 0.2 at % or more and 2.0 at % or less.

(Supplementary Description 4)

Preferably, there is provided the laminate of the supplementary description 3, wherein the concentration of the metallic element in the piezoelectric film is more than 0.6 at % and 2.0 at % or less.

(Supplementary Description 5)

Preferably, there is provided the laminate of any one of the supplementary descriptions 1 to 4, wherein when the piezoelectric film is driven billion times by applying an electric field of sin-wave of 0 kV/cm to 300 kV/cm to the piezoelectric film, a deterioration rate of a piezoelectric constant $d_3$ is 10% or less, the deterioration rate being calculated from a formula: {(a piezoelectric constant $d_{31}$ before driven billion times)−(a piezoelectric constant $d_{31}$ after driven billion times)/(a piezoelectric constant $d_{31}$ before driven billion times)}×100.

(Supplementary Description 6)

Preferably, there is provided the laminate of any one of the supplementary descriptions 1 to 5, wherein the piezoelectric film is oriented preferentially in (001) plane direction with respect to a surface of the substrate.

(Supplementary Description 7)

Preferably, there is provided the laminate of any one of the supplementary descriptions 1 to 6, wherein an electrode film is formed at least between the substrate and the piezoelectric film or on the piezoelectric film.

(Supplementary Description 8)

According to another aspect of the present disclosure, there is provided a method of manufacturing a piezoelectric laminate, including:

forming a piezoelectric film on a substrate, the film containing an alkali niobium oxide of a perovskite structure represented by a composition formula of $(K_{1-x}Na_x)NbO_3$ (0<x<1) and the film having Young's modulus of less than 100 GPa, preferably 53 GPa or more and 73 GPa or less, and more preferably 53 GPa or more and 68 GPa or less.

(Supplementary Description 9)

Preferably, there is provided the method of the supplementary description 8, wherein in forming the piezoelectric film, a film containing a metallic element selected from a group consisting of Mn and Cu at a concentration of 0.2 at % or more and 2.0 at % or less, is formed as the piezoelectric film.

(Supplementary Description 10)

Preferably, there is provided the method of the supplementary description 9, wherein in forming the piezoelectric film, a film containing the metallic element at a concentration of 0.2 at % or more and 0.6 at % or less, is formed as the piezoelectric film, under a condition of more than 600° C. and 700° C. or less, preferably 650° C. or more and 680° C. or less.

(Supplementary Description 11)

Preferably, there is provided the method of the supplementary description 9, wherein in forming the piezoelectric film, a film containing the metallic element at a concentration of more than 0.6 at % and 2.0 at % or less, is formed as the piezoelectric film, under a condition of 500° C. or more and 700° C. or less, preferably 600° C. or more and 680° C. or less, and more preferably 650° C. or more and 680° C. or less.

(Supplementary Description 12)

Preferably, there is provided the method of any one of the supplementary descriptions 8 to 11, including: at least forming an electrode film between the substrate and the piezoelectric film or forming an electrode film on the piezoelectric film.

(Supplementary Description 13)

According to further another aspect of the present disclosure, there is provided a piezoelectric device (piezoelectric element), including:

a piezoelectric laminate including a substrate, a first electrode film formed on the substrate, a piezoelectric film formed on the first electrode film, containing an alkali niobium oxide of a perovskite structure represented by a composition formula of $(K_{1-x}Na_x)NbO_3$ (0<x<1), and having Young's modulus of less than 100 GPa, preferably 53 GPa or more and 73 GPa or less, and more preferably 53 GPa or more and 68 GPa or less, and a second electrode film formed on the piezoelectric film; and at least either a voltage application unit or a voltage detection unit connected between the first electrode film and the second electrode film.

(Supplementary Description 14)

According to further another aspect of the present disclosure, there is provided a piezoelectric device (piezoelectric element), including:

a piezoelectric laminate including a substrate, a piezoelectric film formed on the substrate containing an alkali niobium oxide of a perovskite structure represented by a composition formula of $(K_{1-x}Na_x)NbO_3$ (0<x<1), and having Young's modulus of less than 100 GPa, preferably 53 GPa or more and 73 GPa or less, and more preferably 53 GPa or more and 68 GPa or less, and an electrode film (pattern electrodes) formed on the piezoelectric film; and at least either a voltage application unit or a voltage detection unit connected between electrodes of the electrode film (the pattern electrodes).

What is claimed is:

1. A piezoelectric laminate, comprising:
   a substrate; and
   a piezoelectric film formed on the substrate,
   wherein the piezoelectric film is a film containing an alkali niobium oxide of a perovskite structure represented by a composition formula of $(K_{1-x}Na_x)NbO_3$ (0<x<1), and having Young's modulus of 53 GPa or more and 73 GPa or less.

2. The piezoelectric laminate according to claim 1, wherein a Raman spectrum has an $NbO_6$-peak in a range of 617.5 cm$^{-1}$ to 622.5 cm$^{-1}$, the Raman spectrum being obtained by performing Raman spectroscopy analysis to the piezoelectric film.

3. The piezoelectric laminate according to claim 1, wherein the piezoelectric film contains a metallic element selected from a group consisting of Cu and Mn at a concentration of 0.2 at % or more and 2.0 at % or less.

4. The piezoelectric laminate according to claim 3, wherein the concentration of the metallic element in the piezoelectric film is more than 0.6 at % and 2.0 at % or less.

5. The piezoelectric laminate according to claim 1, wherein when the piezoelectric film is driven billion times by applying an electric field of sin-wave of 0 kV/cm to 300 kV/cm to the piezoelectric film, a deterioration rate of a piezoelectric constant $d_{31}$ is 10% or less, the deterioration rate being calculated from a formula: {(a piezoelectric constant $d_{31}$ before driven billion times)−(a piezoelectric constant $d_{31}$ after driven billion times)/(a piezoelectric constant $d_{31}$ before driven billion times)}×100.

6. A method of manufacturing a piezoelectric laminate, comprising:
   forming a piezoelectric film on a substrate, the film containing an alkali niobium oxide of a perovskite structure represented by a composition formula of $(K_{1-x}Na_x)NbO_3$ (0<x<1) and the film having Young's modulus of 53 GPa or more and 73 GPa or less.

7. The method of manufacturing a piezoelectric laminate according to claim 6, wherein in forming the piezoelectric film, a film containing a metallic element selected from a group consisting of Mn and Cu at a concentration of 0.2 at % or more and 2.0 at % or less, is formed as the piezoelectric film.

8. The method of manufacturing a piezoelectric laminate according to claim 7, wherein in forming the piezoelectric film, a film containing the metallic element at a concentration of 0.2 at % or more and 0.6 at % or less, is formed as the piezoelectric film, under a condition of more than 600° C. and 700° C. or less.

9. The method of manufacturing a piezoelectric laminate according to claim 7, wherein in forming the piezoelectric film, a film containing the metallic element at a concentration of more than 0.6 at % and 2.0 at % or less, is formed as the piezoelectric film, under a temperature condition of 500° C. or more and 700° C. or less.

10. A piezoelectric device, comprising:
    a piezoelectric laminate comprising a substrate, a first electrode film formed on the substrate, a piezoelectric film formed on the first electrode film containing an alkali niobium oxide of a perovskite structure represented by a composition formula of $(K_{1-x}Na_x)NbO_3$ (0<x<1), and having Young's modulus of 53 GPa or more and 73 GPa or less, and a second electrode film formed on the piezoelectric film; and
    at least either a voltage application unit or a voltage detection unit connected between the first electrode film and the second electrode film.

* * * * *